(12) United States Patent
Jung

(10) Patent No.: US 11,864,398 B2
(45) Date of Patent: Jan. 2, 2024

(54) BONDING DEVICE AND METHOD OF FABRICATING DISPLAY DEVICE USING THE SAME

(71) Applicant: Samsung Display Co., Ltd., Yongin-si (KR)

(72) Inventor: Taehyeog Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/994,844

(22) Filed: Nov. 28, 2022

(65) Prior Publication Data

US 2023/0292580 A1    Sep. 14, 2023

(30) Foreign Application Priority Data

Mar. 10, 2022    (KR) .................... 10-2022-0030117

(51) Int. Cl.
*H10K 71/00*     (2023.01)
*B32B 38/00*     (2006.01)
*B32B 37/18*     (2006.01)
*B32B 38/18*     (2006.01)
*B32B 37/10*     (2006.01)
(Continued)

(52) U.S. Cl.
CPC ............ *H10K 71/00* (2023.02); *B32B 37/10* (2013.01); *B32B 37/18* (2013.01); *B32B 38/0012* (2013.01); *B32B 38/1866* (2013.01); *H10K 71/50* (2023.02); *B32B 37/003* (2013.01); *B32B 37/0046* (2013.01); *B32B 2457/20* (2013.01); *Y10T 156/1028* (2015.01)

(58) Field of Classification Search
CPC ............ B32B 37/003; B32B 37/0046; B32B 2457/20; B32B 2457/202; B32B 2457/204; B32B 2457/206; B32B 2457/208; B32B 38/1866; B32B 37/1009; B32B 2037/1072; Y10T 156/1028
See application file for complete search history.

(56) References Cited

U.S. PATENT DOCUMENTS 9,498,938 B2    11/2016   Son et al.
11,289,686 B2    3/2022   Jung et al.
(Continued)

FOREIGN PATENT DOCUMENTS

KR            101701247 B1    2/2017
KR         1020190020495 A    3/2019
(Continued)

*Primary Examiner* — Carson Gross
(74) *Attorney, Agent, or Firm* — CANTOR COLBURN LLP

(57) ABSTRACT

A bonding device includes: a stage and a pressing part, which is placed on the stage and is movable toward the stage. A first layer, which is disposed on an upper surface of the stage, includes a first flat portion and first bending portions. A second layer, which is disposed below a lower surface of the pressing part, includes a second flat portion and second bending portions. The first and second bending portions may be disposed between the stage and the pressing part, in a state bent with curvatures, respectively. The curvature of a lower surface of each of the second bending portions is smaller than the curvature of an upper surface of each of the first bending portions.

6 Claims, 15 Drawing Sheets

(51) Int. Cl.
*H10K 71/50* (2023.01)
*B32B 37/00* (2006.01)

(56) References Cited

U.S. PATENT DOCUMENTS

2016/0318293 A1* 11/2016 Kim .................... B32B 38/1841
2020/0130340 A1* 4/2020 Choi ....................... B32B 37/10

FOREIGN PATENT DOCUMENTS

KR 1020190130105 A 11/2019
KR 102285091 B1 8/2021

* cited by examiner

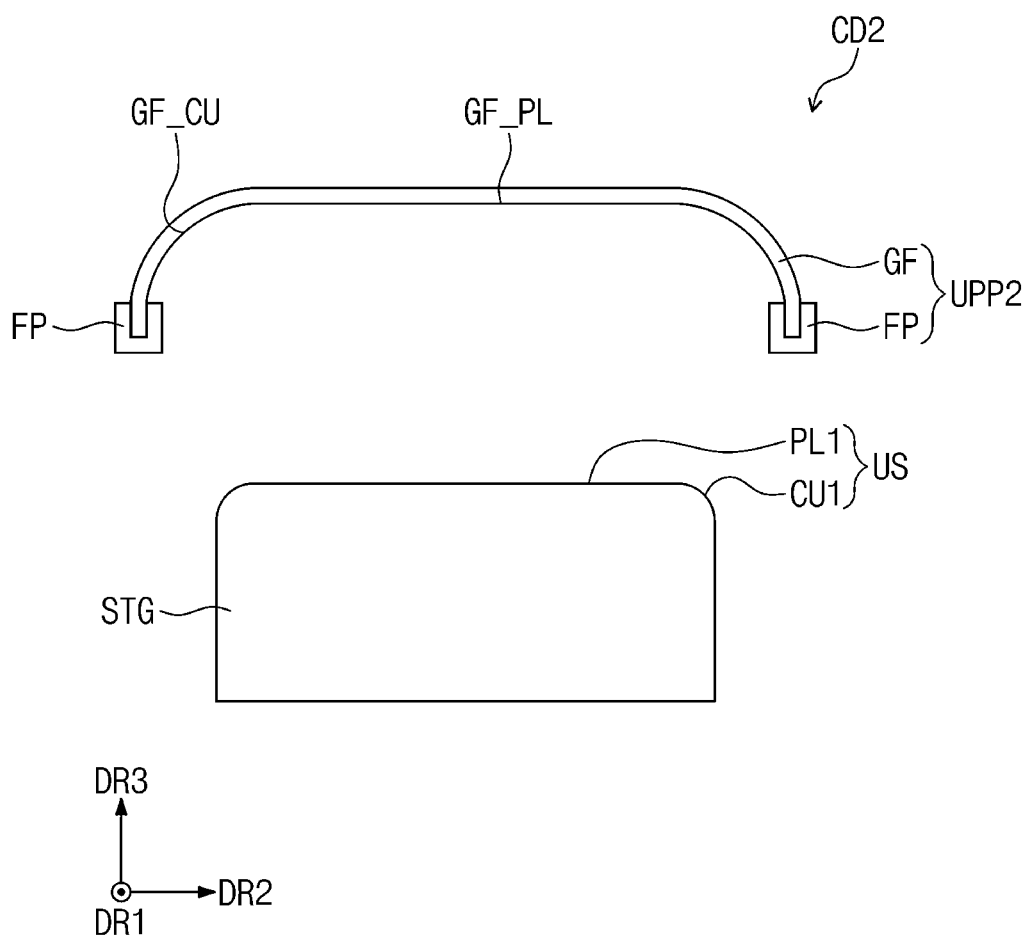

BONDING DEVICE AND METHOD OF FABRICATING DISPLAY DEVICE USING THE SAME

This application claims priority to Korean Patent Application No. 10-2022-0030117, filed on Mar. 10, 2022, and all the benefits accruing therefrom under 35 U.S.C. § 119, the content of which in its entirety is herein incorporated by reference.

BACKGROUND

The present disclosure relates to a bonding device and a method of bonding a display device using the same.

Various portable electronic devices are being widely used. Small-size electronic devices, such as mobile phones, are examples of the portable electronic devices, and tablet personal computers ("PCs") are also being widely used.

With the recent development of display technology, display devices of various shapes are being developed. For example, curved or flexible display panels, which are curvedly deformed or are folded or rolled when a force is exerted on a flat display panel, are being developed. In addition, a display device having a curved side surface is also being developed.

The display device includes a display panel, a window disposed on the display panel, and a supporting plate disposed below the display panel. The window is configured to protect the display panel from external scratch and impact. The supporting plate is used to supports the display panel.

A bonding device is used to bond the display panel to the supporting plate and/or to bond the window to the display panel. For the display device having the curved side surface, each of the supporting plate, the display panel, and the window may be provided to have curvedly-bent side portions that are opposite to each other. Thus, there is an increasing demand for a bonding technology capable of more easily bonding the bent side portions of the supporting plate, the display panel, and the window.

SUMMARY

An embodiment of the invention provides a bonding device, which is configured to perform a bonding process on bent side portions of a display device more easily, and a method of fabricating a display device using the same.

According to an embodiment of the invention, a bonding device includes: a stage and a pressing part placed on the stage and which is movable toward the stage. A first layer, which is disposed on an upper surface of the stage, includes a first flat portion and first bending portions, which are curvedly extended from opposite side portions of the first flat portion, respectively. A second layer, which is disposed below a lower surface of the pressing part to face the first layer, includes a second flat portion and second bending portions, which are curvedly extended from opposite side portions of the second flat portion, respectively. The first and second bending portions are disposed between the stage and the pressing part, in a state bent with curvatures, respectively. The curvature of a lower surface of each of the second bending portions is smaller than the curvature of an upper surface of each of the first bending portions.

In an embodiment, a curvature radius of the lower surface of each of the second bending portions may be set to a value that is larger than a sum of a curvature radius of a lower surface of each of the first bending portions and a thickness of each of the first bending portions.

In an embodiment, the second flat portion may be bonded to the first flat portion by the pressing part, which moves in a downward direction.

In an embodiment, the second bending portion may be spaced apart from the first bending portion, when the second flat portion is bonded to the first flat portion at first.

In an embodiment, the bonding device may further include a plurality of pressing rollers, which are disposed over the stage and are spaced apart from the pressing part.

In an embodiment, the pressing rollers may be disposed on the second bending portions, and the second bending portions may be bonded to the first bending portion by the pressing rollers, which exerts a pressure on the second bending portions.

In an embodiment, the pressing part may have a flat shape, and the second flat portion may be in contact with a lower surface of the pressing part. The second bending portions may be disposed outside the pressing part, such that the second bending portions are not in contact with the lower surface of the pressing part.

In an embodiment, an upper surface of the stage facing the pressing part may include a first plane and first curved surfaces, which are extended from opposite side portions of the first plane in outward and downward directions and have a convexly curved shape. The first flat portion may be disposed on the first plane, and the first bending portions may be disposed on the first curved surfaces, respectively. The first curved surfaces and the first bending portions may have the same curvature.

In an embodiment, the pressing part may include a guide film disposed on the second layer and fastening parts connected to opposite side portions of the guide film, respectively. The guide film and the second layer may have the same shape.

In an embodiment, the guide film may include a flat portion and bending portions, which are extended from opposite side portions of the flat portion of the guide film in the outward and downward directions. Each of the bending portions may have a curvature smaller than a curvature of each of the first curved surfaces.

In an embodiment, the guide film may be moved in the downward direction to bond the second flat portion to the first flat portion, and the second bending portions may be bonded to the first bending portions by the fastening parts, which moves toward side surfaces of the stage.

In an embodiment, the pressing part may include a recessed portion facing the upper surface of the stage. The recessed portion may include a second plane facing the first plane and second curved surfaces, which are provided to face the first curved surfaces and are extended downward from opposite side portions of the second plane to have a concavely curved shape. The second flat portion may be disposed below the second plane, and the second bending portions may be disposed below the second curved surfaces.

In an embodiment, the second curved surfaces may have a curvature smaller than a curvature of each of the first curved surfaces.

In an embodiment, the second curved surfaces may have the same curvature as the second bending portions.

In an embodiment, an air injection hole, which is recessed from an outer surface of the pressing part toward the second curved surfaces, may be defined in the pressing part. The second curved surfaces may be expanded toward the first bending portions by air injected into the air injection hole, after the second flat portion is bonded to the first flat portion by the pressing part, which moves in the downward direction.

According to an embodiment of the invention, a method of bonding a display device includes: providing a first layer on a stage, where the first layer includes a first flat portion and first bending portions, which are curvedly extended from opposite side portions of the first flat portion, respectively; providing a second layer below a pressing part disposed over the stage, where the second layer includes a second flat portion and second bending portions, which are curvedly extended from opposite side portions of the second flat portion, respectively; moving the pressing part in a downward direction to bond the second flat portion to the first flat portion, and pressing the second bending portions toward the first bending portions to bond the second bending portions to the first bending portions. Before the bonding of the second bending portions to the first bending portions, the first and second bending portions are disposed between the stage and the pressing part, in a state bent with curvatures, respectively, and the curvature of a lower surface of each of the second bending portions is smaller than the curvature of an upper surface of each of the first bending portions.

In an embodiment, a curvature radius of the lower surface of each of the second bending portions may be set to a value that is larger than a sum of a curvature radius of a lower surface of each of the first bending portions and a thickness of each of the first bending portions, before the bonding of the second bending portions to the first bending portions. The second bending portion may be spaced apart from the first bending portion, when the second flat portion is bonded to the first flat portion at first.

In an embodiment, the second bending portions may be pressed toward the first bending portions by pressing rollers disposed on the second bending portions, when the second bending portions are bonded to the first bending portions.

In an embodiment, the pressing part may include a guide film, which is disposed on the second layer, and fastening parts, which are connected to opposite side portions of the guide film, respectively. The guide film may have the same shape as the second layer. The bonding of the second flat portion to the first flat portion may include moving the guide film in the downward direction to bond the second flat portion to the first flat portion. The bonding of the second bending portions to the first bending portions may include moving the fastening parts toward side surfaces of the stage to bond the second bending portions to the first bending portions.

In an embodiment, an upper surface of the stage facing the pressing part may include a first plane and first curved surfaces, which are extended from opposite side portions of the first plane in outward and downward directions and have a convexly curved shape. The first flat portion may be disposed on the first plane. The first bending portions may be disposed on the first curved surfaces, respectively, and the pressing part may include a recessed portion facing the upper surface of the stage. The recessed portion may include a second plane facing the first plane, and second curved surfaces, which are provided to face the first curved surfaces and are extended downward from opposite side portions of the second plane to have a concavely curved shape. The second flat portion may be disposed below the second plane, and the second bending portions may be disposed below the second curved surfaces. An air injection hole may be defined to be recessed from an outer surface of the pressing part toward the second curved surfaces. The second curved surfaces may be expanded toward the first bending portions by air injected into the air injection hole, after the bonding of the second flat portion to the first flat portion using the pressing part moving in the downward direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 7 is a diagram illustrating a structure of a bonding device according to another embodiment of the invention.

DETAILED DESCRIPTION

Figure 1:
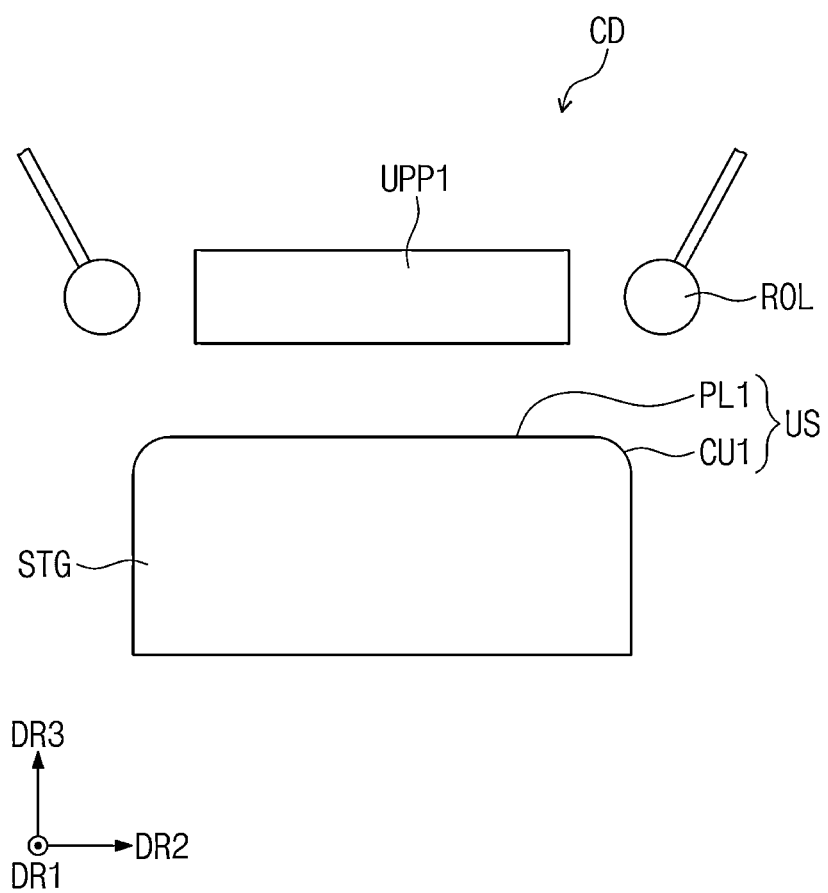
FIG. 1 is a conceptual diagram illustrating a bonding device according to an embodiment of the invention.

Example embodiments of the inventions will now be described more fully with reference to the accompanying drawings, in which example embodiments are shown. Example embodiments of the inventions may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a conceptual diagram illustrating a bonding device according to an embodiment of the invention.

Referring to FIG. 1, a bonding device CD according to an embodiment of the invention may include a stage STG, a pressing part UPP1 disposed over the stage STG, and a plurality of pressing rollers ROL, which are disposed over the stage STG and are spaced apart from the pressing part UPP1. FIG. 1 illustrates a cross-section of the bonding device CD, when viewed in a first direction DR1.

The stage STG may include an upper surface US facing the pressing part UPP1.

The upper surface US of the stage STG may include a first plane PL1 and first curved surfaces CU1, which are extended from opposite side portions of the first plane PL1 in outward and downward directions and have a convexly curved shape.

The first plane PL1 may have a plane that is defined by two different directions (e.g., first and second directions DR1 and DR2). When viewed in the first direction DR1, each of the first curved surfaces CU1 may be a surface that is curved with a specific curvature.

Hereinafter, a direction, which is normal to the plane defined by the first and second direction DR1 and DR2, may be defined as a third direction DR3. In the present specification, the expression "when viewed in a plan view" in the present specification will be used to describe a structure viewed in the third direction DR3. Furthermore, directions indicated by terms "upward direction", "downward direction", and "vertical direction" may be defined based on the third direction DR3.

The pressing part UPP1 may have a flat shape. For example, the pressing part UPP1 may have a plane defined by the first and second direction DR1 and DR2.

The pressing part UPP1 may be configured to reciprocally move in the third direction DR3. For example, the pressing part UPP1 may be configured to move toward the stage STG (i.e., in the downward direction) or to move away from the stage STG (e.g., in the upward direction).

Each of the pressing rollers ROL may have a circular shape, when viewed in the first direction DR1. The pressing part UPP1 may be disposed between the pressing rollers ROL. Each of the pressing rollers ROL may be configured to rotate about its rotation axis parallel to the first direction DR1. The pressing rollers ROL will be described in more detail with reference to a fabricating method of a display device DD.

Figure 2:
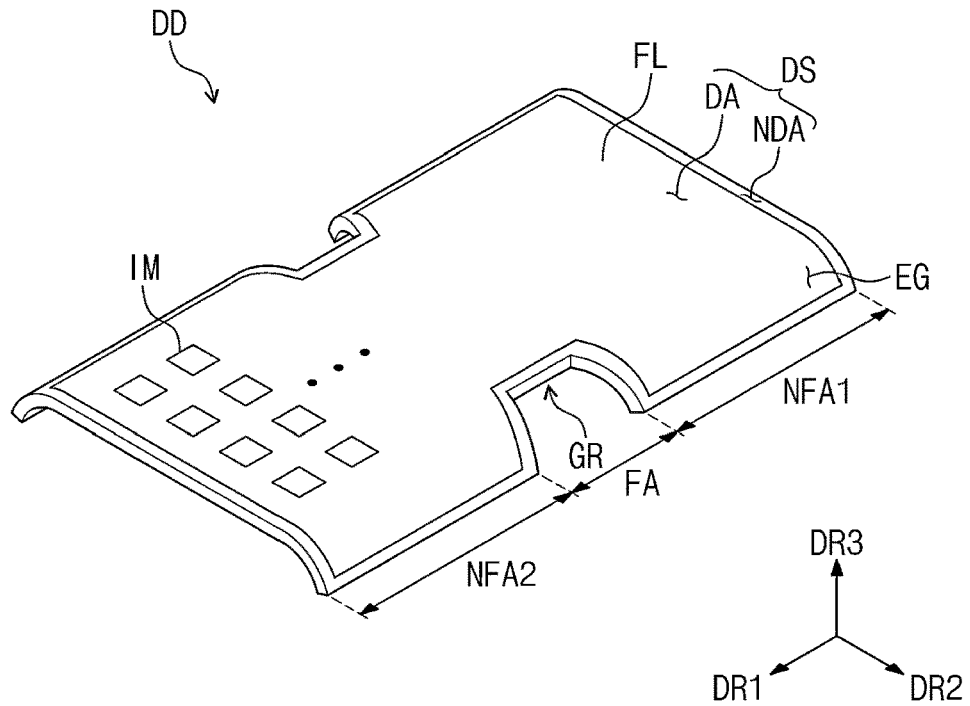
FIG. 2 is a conceptual diagram illustrating a display device fabricated by a bonding device.

FIG. 2 is a diagram illustrating a display device fabricated by a bonding device.

Referring to FIG. 2, a display device DD may be more lengthily extended in the first direction DR1 than in the second direction DR2. The display device DD may include a folding region FA and a plurality of non-folding regions NFA1 and NFA2. The non-folding regions NFA1 and NFA2 may include a first non-folding region NFA1 and a second non-folding region NFA2. The folding region FA may be disposed between the first non-folding region NFA1 and the second non-folding region NFA2. The first non-folding region NFA1, the folding region FA, and the second non-folding region NFA2 may be arranged in the first direction DR1.

Although one folding region FA and two non-folding regions NFA1 and NFA2 are illustrated, the numbers of the folding and non-folding regions are not limited to this example. For example, the display device DD may include three or more non-folding regions and a plurality of folding regions, which are disposed between the non-folding regions.

An upper surface of the display device DD may be defined as a display surface DS and may have a plane (i.e., flat surface) defined by the first and second directions DR1 and DR2. Images IM generated by the display device DD may be provided to a user through the display surface DS.

The display surface DS may include a display region DA and a non-display region NDA around or near the display region DA. The display region DA may be used to display an image, and the non-display region NDA may not be used to display an image. The non-display region NDA may be disposed to enclose the display region DA and to define an edge of the display device DD, which is printed with a specific color.

The display device DD may include a flat portion FL, which has a flat shape, and curved surface portions EG, and here, the curved surface portions EG may be curvedly extended from side portions of the flat portion FL, which are opposite to each other in the second direction DR2, in outward and downward directions.

The curved surface portions EG may be curved with a specific curvature in the second direction DR2.

Grooves GR may be defined in side portions of the display device DD, which are opposite to each other in the second direction DR2. The grooves GR may be overlapped with the folding region FA. The grooves GR may be formed defined in the display device DD by partially removing the curved surface portions EG overlapped with the folding region FA.

Figure 3:
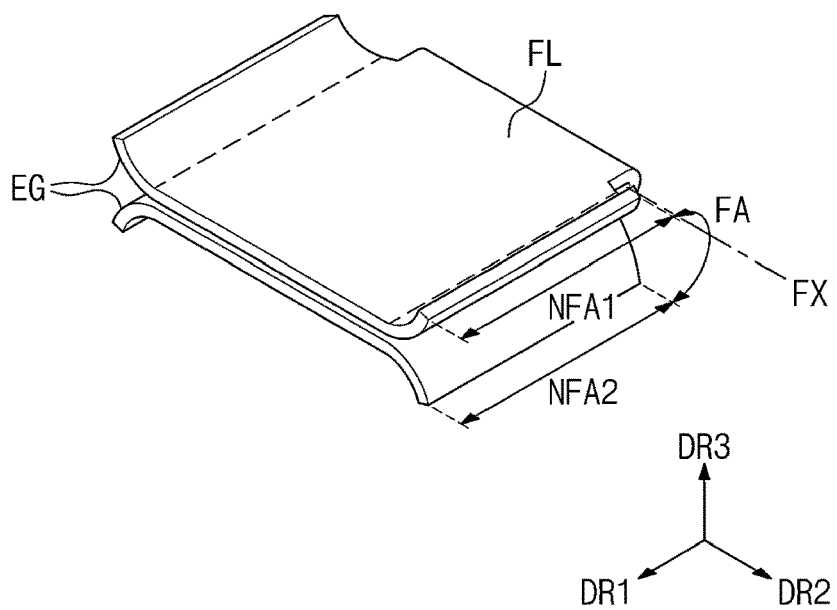
FIG. 3 is a diagram illustrating a folding state of the display device of FIG. 2.

FIG. 3 is a diagram illustrating a folding state of the display device of FIG. 2.

Referring to FIG. 3, the display device DD may be a foldable display device that can be folded and unfolded. For example, the folding region FA may be bent along a folding axis FX parallel to the first direction DR1, when the display device DD is folded.

In an embodiment, the display device DD may be folded in such an in-folding manner that the first and second non-folding regions NFA1 and NFA2 face each other and the display surface DS is not exposed to the outside. However, the invention is not limited to this example. For example, the display device DD may be folded along the folding axis FX in an out-folding manner such that the display surface DS is exposed to the outside.

Figure 4:
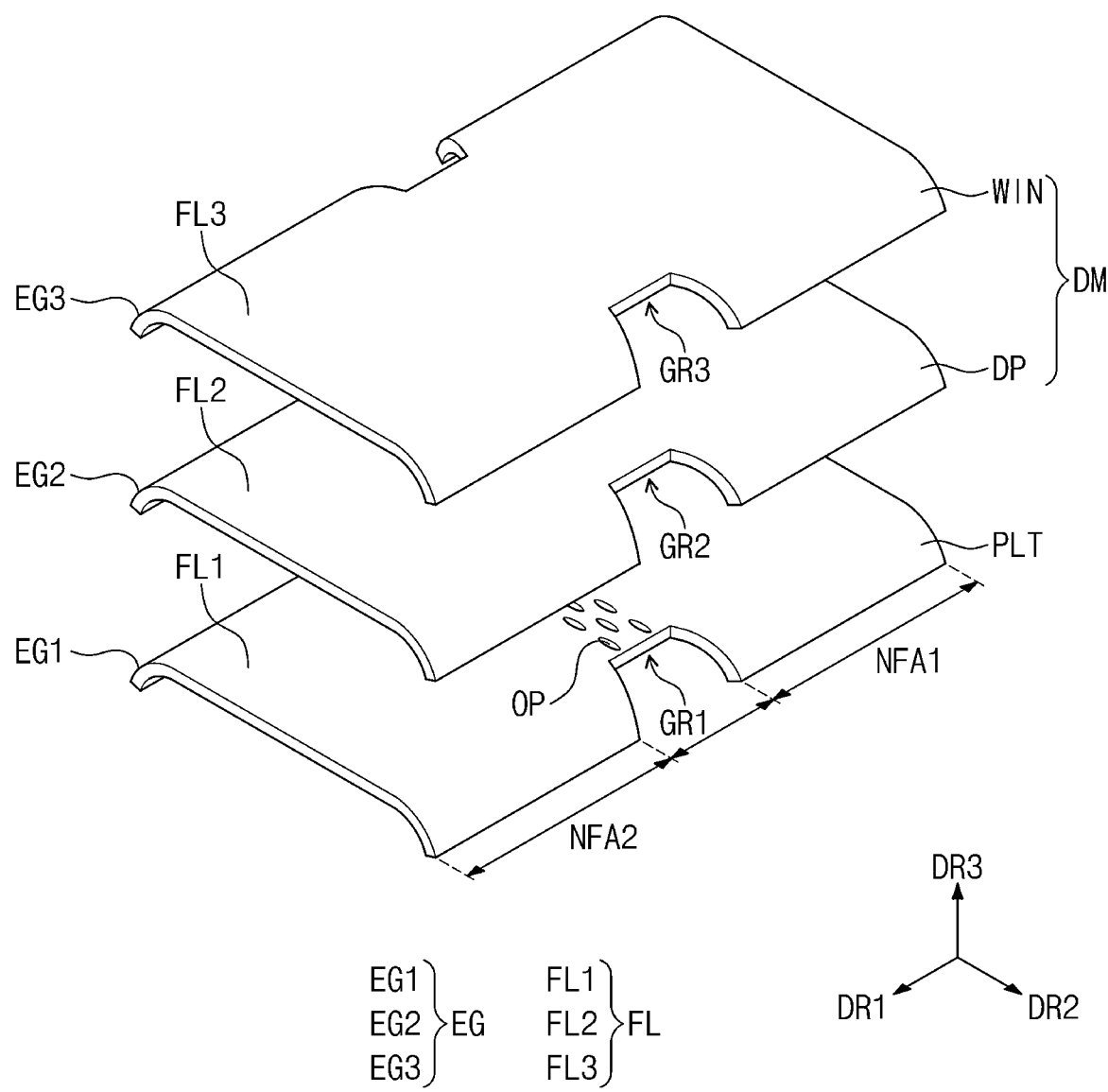
FIG. 4 is an exploded perspective view illustrating the display device shown in FIG. 2.

FIG. 4 is an exploded perspective view illustrating the display device shown in FIG. 2.

Referring to FIG. 4 the display device DD may include a display module DM and a supporting plate PLT, which is disposed below the display module DM. The supporting plate PLT may be provided under the display module DM to support the display module DM. The supporting plate PLT may be more lengthily extended in the first direction DR1 than in the second direction DR2.

The supporting plate PLT may be disposed below the display module DM to support the display module DM. The supporting plate PLT may have stiffness higher than the display module DM. The supporting plate PLT may be formed of or include at least one of metallic materials (e.g., stainless steel). For example, the supporting plate PLT may be formed of or include SUS 304, but in an embodiment, the metallic material in the supporting plate PLT may be variously changed. Furthermore, in an embodiment, the supporting plate PLT may be formed of or include at least one of nonmetallic materials (e.g., glass or plastic materials).

A plurality of openings OP may be defined in a region of the supporting plate PLT overlapped with the folding region FA. The openings OP may be formed to penetrate the region of the supporting plate PLT in the third direction DR3.

Since the openings OP are defined in the region of the supporting plate PLT overlapped with the folding region FA, the region of the supporting plate PLT overlapped with the folding region FA may have high flexibility. As a result, the supporting plate PLT may be easily folded along the folding region FA.

The supporting plate PLT may include a first flat portion FL1 and first bending portions EG1, which are curvedly extended from opposite side portions of the first flat portion FL1 in outward and downward directions. The opposite side portions of the first flat portion FL1 may be opposite to each other in the second direction DR2. The first flat portion FL1 may have a plane (i.e., a flat surface) defined by the first and second direction DR1 and DR2. The first bending portions EG1 may have a shape that is curved with a specific curvature, when viewed in the first direction DR1.

First grooves GR1 may be defined in opposite side portions of the supporting plate PLT, which are opposite to each other in the second direction DR2. The first grooves GR1 may be overlapped with the folding region FA. Portions of the first bending portions EG1, which are overlapped with the folding region FA, may be removed, and thus, the first grooves GR1 may be defined in the supporting plate PLT.

The display module DM may include a window WIN and a display panel DP disposed below the window WIN. The window WIN and the display panel DP may be more lengthily extended in the first direction DR1 than in the second direction DR2. The display panel DP may be used to display an image. The window WIN may protect the display panel DP from an external scratch or impact. The supporting plate PLT may be disposed below the display panel DP to support the display panel DP.

In an embodiment, the display panel DP may be a light-emitting type display panel, but the invention is not limited to a specific type of the display panel DP. For example, the display panel DP may be an organic light-emitting display panel or a quantum dot light-emitting display panel. A light-emitting layer of the organic light-emitting display panel DP may be formed of or include an organic light-emitting material. A light-emitting layer of the quantum dot light-emitting display panel may include quantum dots and/or quantum rods.

The display panel DP may be a flexible display panel. For example, the display panel DP may include a plurality of electronic devices disposed on a flexible substrate.

The display panel DP may include a second flat portion FL2 and second bending portions EG2, which are curvedly extended from opposite side portions of the second flat portion FL2 in outward and downward directions. The opposite side portions of the second flat portion FL2 may be opposite to each other in the second direction DR2. The second flat portion FL2 may have a plane (i.e., a flat surface) defined by the first and second direction DR1 and DR2. The second bending portions EG2 may have a shape that is curved with a specific curvature, when viewed in the first direction DR1.

Second grooves GR2 may be defined in opposite side portions of the display panel DP, which are opposite to each other in the second direction DR2. The second grooves GR2 may be overlapped with the folding region FA. Portions of the second bending portions EG2, which are overlapped with the folding region FA, may be removed, and thus, the second grooves GR2 may be defined in the display panel DP.

The bonding device CD of FIG. 1 may be used to bond the display panel DP to the supporting plate PLT. The bonding operation will be described in more detail with reference to FIGS. 6A to 6I.

The window WIN may be disposed on the display panel DP. The window WIN may have an optically transparent property. The window WIN may be formed of or include glass. However, the invention is not limited to this example, and in an embodiment, the window WIN may include a synthetic resin film.

The window WIN may have a multi-layered structure or a single-layered structure. For example, the window WIN may include a plurality of synthetic resin films, which are combined to each other by an adhesive material, or a glass substrate and a synthetic resin film, which are combined to each other by an adhesive material.

The window WIN may include a third flat portion FL3 and third bending portions EG3, which are curvedly extended from opposite side portions of the third flat portion FL3 in outward and downward directions. The opposite side portions of the third flat portion FL3 may be opposite to each other in the second direction DR2. The third flat portion FL3 may have a plane defined by the first and second direction DR1 and DR2. The third bending portions EG3 may have a shape that is curved with a specific curvature, when viewed in the first direction DR1.

Third grooves GR3 may be defined in opposite side portions of the window WIN, which are opposite to each other in the second direction DR2. The third grooves GR3 may be overlapped with the folding region FA. Portions of the third bending portions EG3, which are overlapped with the folding region FA, may be removed, and thus, the third grooves GR3 may be defined in the window WIN.

The bonding device CD of FIG. 1 may be used to bond the window WIN to the display panel DP. The bonding process will be described in more detail with reference to FIGS. 6A to 6I.

Figure 5:
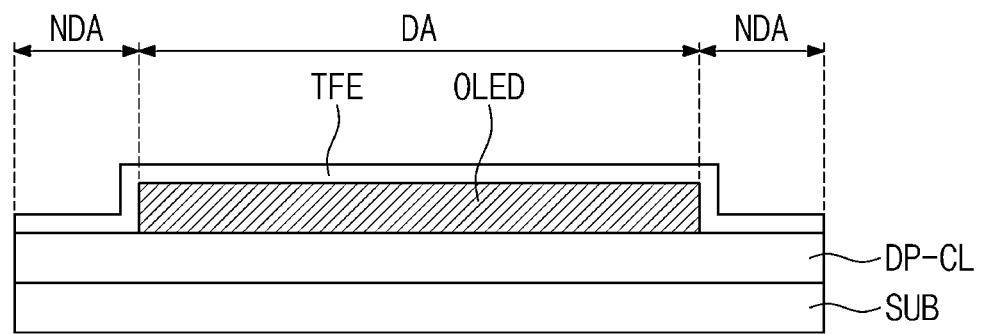
FIG. 5 is a sectional view exemplarily illustrating a display panel.

FIG. 5 is a sectional view exemplarily illustrating a display panel.

Referring to FIG. 5, the display panel DP may include a substrate SUB, a circuit device layer DP-CL disposed on the substrate SUB, a display element layer DP-OLED disposed on the circuit device layer DP-CL, and a thin encapsulation layer TFE disposed on the display element layer DP-OLED.

The substrate SUB may include the display region DA and the non-display region NDA around the display region DA. The substrate SUB may be formed of or include at least one of glass or flexible plastic materials (e.g., poly imide ("PI")). The display element layer DP-OLED may be disposed on the display region DA.

The circuit device layer DP-CL and the display element layer DP-OLED may be provided to have a plurality of pixels. Each of the pixels may include a transistor, which is disposed in the circuit device layer DP-CL, and a light-emitting device, which is disposed in the display element layer DP-OLED and is connected to the transistor.

The thin encapsulation layer TFE may be disposed on the circuit device layer DP-CL to cover the display element layer DP-OLED. The thin encapsulation layer TFE may protect pixels from moisture, oxygen, and external contamination materials.

FIGS. 6A to 6I are diagrams illustrating a method of bonding a display device using the bonding device of FIG. 1.

Figure 6A:
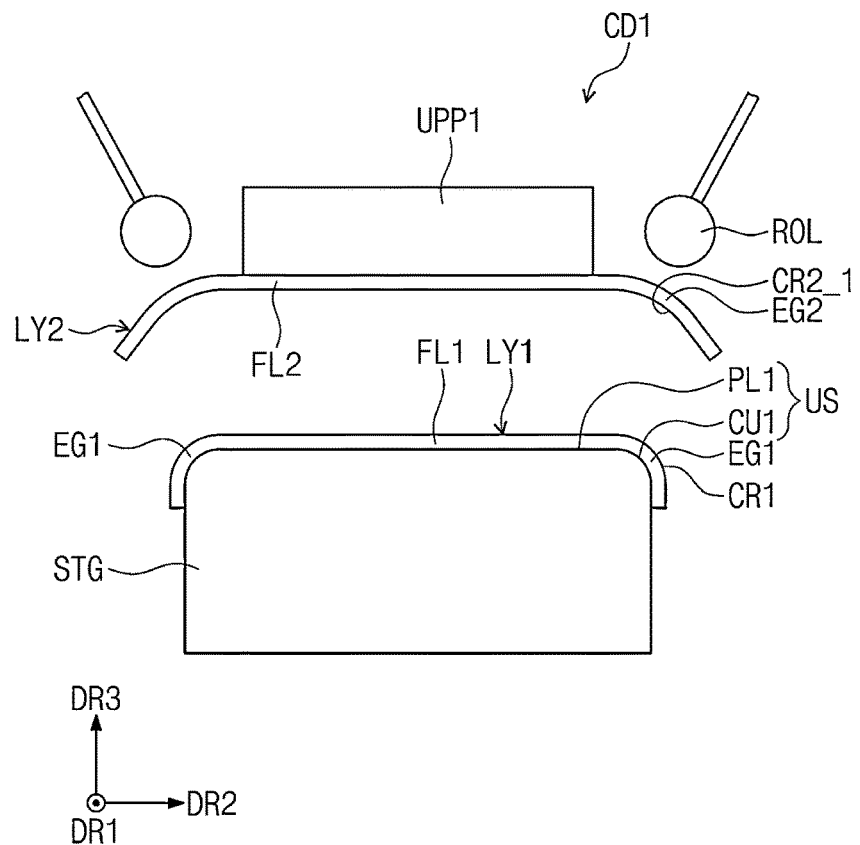
FIGS. 6A to 6I are diagrams illustrating a method of bonding a display device using the bonding device of FIG. 1.

Referring to FIG. 6A, when a bonding process of the display device DD using a bonding device CD1 is performed, a first layer LY1 and a second layer LY2 may be disposed between the stage STG and the pressing part UPP1. The first layer LY1 may be disposed on the stage STG, the second layer LY2 may be disposed over the first layer LY1, and the pressing part UPP1 may be disposed on the second layer LY2. The second layer LY2 may face the first layer LY1.

The first layer LY1 may be substantially the supporting plate PLT of FIG. 4. Thus, similar to the supporting plate PLT, the first layer LY1 may include the first flat portion FL1 and the first bending portions EG1, which are curvedly extended from the opposite side portions of the first flat portion FL1 in outward and downward directions. The first bending portions EG1 may be bent with a specific curvature and may be placed on the upper surface US of the stage STG, when viewed in the first direction DR1. A lower surface of the first layer LY1 may have the same shape as the upper surface of the stage STG.

The first flat portion FL1 may be disposed to be in contact with the first plane PL1 of the stage STG. The first bending portions EG1 may be disposed to be in contact with the first curved surfaces CU1, respectively. Lower surfaces of the first bending portions EG1 may be bent to have the same curvature as the first curved surfaces CU1.

The second layer LY2 may be substantially the display panel DP of FIG. 4. Thus, the second layer LY2 may include the second flat portion FL2 and the second bending portions EG2, which are curvedly extended from the opposite side portions of the second flat portion FL2 in outward and downward directions, like the display panel DP.

The second flat portion FL2 may be disposed below a lower surface of the pressing part UPP1. The second flat portion FL2 may be disposed to be in contact with the lower surface of the pressing part UPP1. The second bending portions EG2 may be bent with a specific curvature and may be placed below the pressing part UPP1, when viewed in the first direction DR1. The second bending portions EG2 may be disposed outside the pressing part UPP1 such that they are not in contact with the lower surface of the pressing part UPP1. The first and second bending portions EG1 and EG2 may be placed between the stage STG and the pressing part UPP1, in a state bent with a specific curvature.

A curvature CR2_1 of a lower surface of each of the second bending portions EG2 may be smaller than a curvature CR1 of an upper surface of each of the first bending portions EG1. This structure will be described in more detail with reference to FIG. 6C.

Figure 6B:
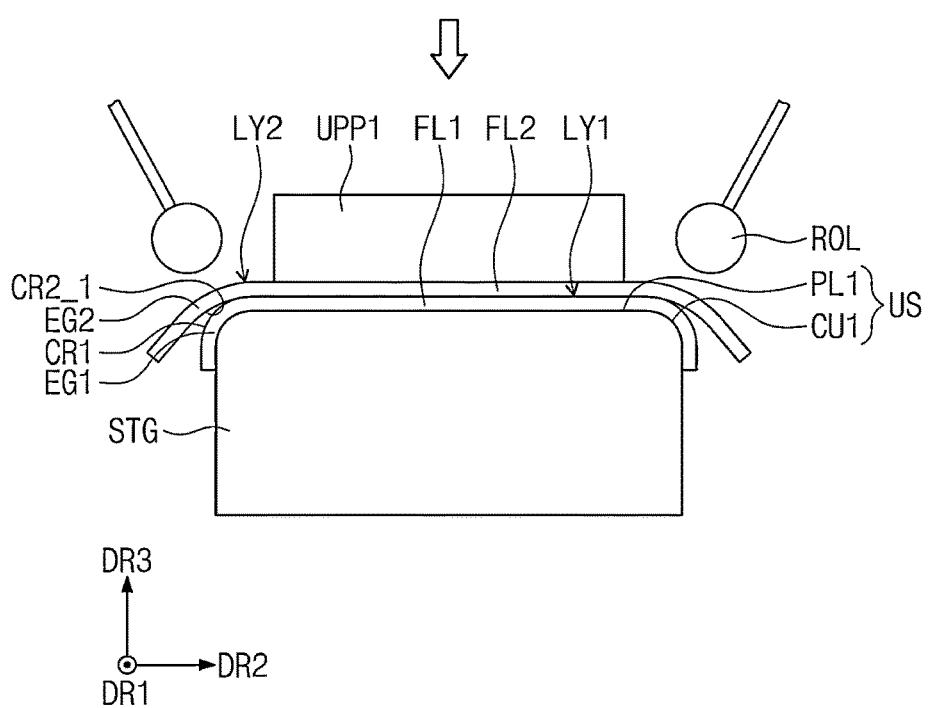

Referring to FIG. 6B, the pressing part UPP1 may be moved toward the stage STG or in the downward direction to bond the second layer LY2 to the first layer LY1.

The second flat portion FL2 may be bonded to the first flat portion FL1 by the pressing part UPP1 moving in the downward direction. Although not shown, an adhesive layer may be disposed between the first and second layers LY1 and LY2 to attach the second layer LY2 to the first layer LY1. The adhesive layer may be attached to an upper surface of the first layer LY1 in advance, or the adhesive layer, which is attached to a lower surface of the second layer LY2, may be disposed between the first and second layers LY1 and LY2. The second bending portions EG2 and the first bending portions EG1 may be spaced apart from each other, when the second flat portion FL2 is bonded to the first flat portion FL1.

The second bending portions EG2 and the first bending portions EG1 may be spaced apart from each other, because the curvature CR2_1 of the lower surface of the second bending portion EG2 is smaller than the curvature CR1 of the upper surface of the first bending portion EG1 when the second flat portion FL2 is bonded to the first flat portion FL1.

Figure 6C:
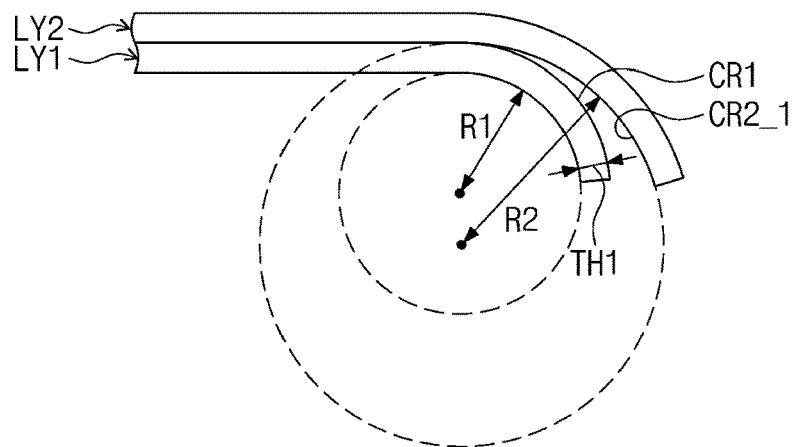

FIG. 6C is an enlarged view of the first and second bending portions shown in FIG. 6B.

Referring to FIG. 6C, the curvature CR2_1 of the lower surface of the second bending portion EG2 may be smaller than the curvature CR1 of the upper surface of the first bending portion EG1. The lower surface of the second bending portion EG2 may have a concavely curved surface. The upper surface of the first bending portion EG1 may have a convexly curved surface.

The curvature radius R2 of the lower surface of the second bending portion EG2 may be set to a value that is larger than a sum of a curvature radius R1 of a lower surface of the first bending portion EG1 and a thickness TH1 of the first bending portion EG1.

Thus, the curvature radius R2 of the lower surface of the second bending portion EG2 may be greater than the curvature radius R1 of the lower surface of the first bending portion EG1. The thickness TH1 may be defined as a length measured in a direction perpendicular to a tangential surface of the curved upper surface of the first bending portion EG1. For example, the thickness TH1 may be a value measured in the direction normal to the upper surface of the first bending portion EG1.

The curvature and the curvature radius are concepts that are opposite to each other. Thus, the curvature CR2_1 of the lower surface of the second bending portion EG2 may be smaller than the curvature CR1 of the upper surface of the first bending portion EG1. In other words, the second bending portion EG2 may be bent less than the first bending portion EG1, and the first bending portion EG1 may be bent more than the second bending portion EG2.

Due to this structure, the second bending portion EG2 may have a curvature smaller than a curvature of the first bending portion EG1, and thus, the second bending portions EG2 may be spaced apart from the first bending portions EG1, when the first flat portion FL1 is bonded to the second flat portion FL2.

Figure 6D:
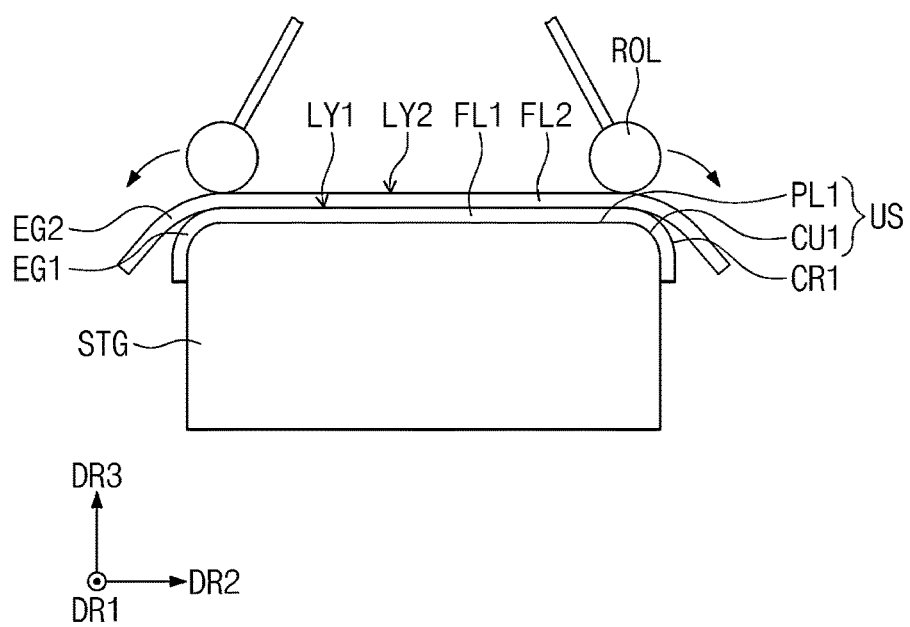
Figure 6E:
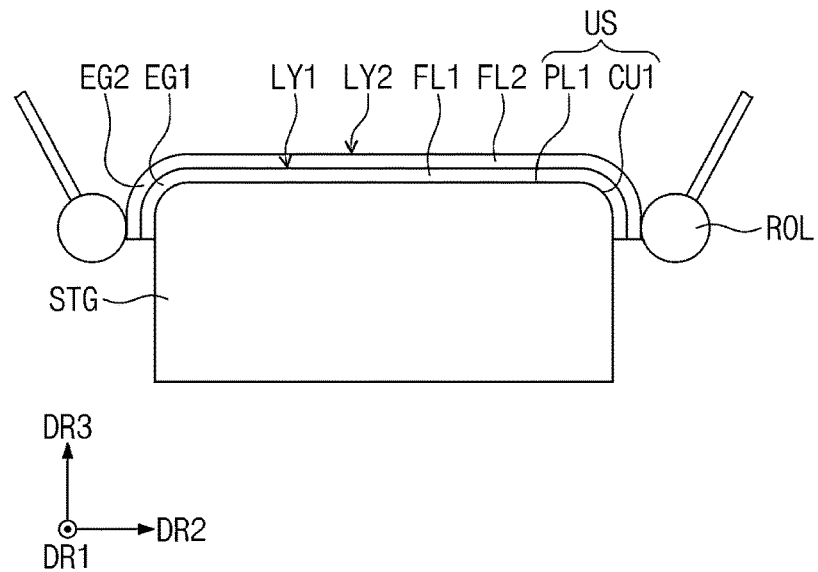

Referring to FIGS. 6D and 6E, when the first and second flat portions FL1 and FL2 are bonded to each other, the pressing rollers ROL may be placed on the second bending portions EG2. The pressing rollers ROL may press the second bending portions EG2 toward the first bending portions EG1. The second bending portions EG2 may be pressed by the pressing rollers ROL and may be bonded to the first bending portions EG1. For example, in the case where the second bending portions EG2 are pressed by the pressing rollers ROL, the second bending portions EG2 may be moved toward the first bending portions EG1 and may be bonded to the first bending portions EG1.

If the second bending portions EG2 have the same curvature as the first bending portions EG1 before pressed by the pressing rollers ROL, the second bending portions EG2 may be in contact with the first bending portions EG1 in advance before the bonding of the first and second flat portions FL1 and FL2. For example, lower portions of the second bending portions EG2 may be previously bonded to the first bending portions EG1 before the bonding of the first and second flat portions FL1 and FL2.

In this case, the second flat portion FL2 may not be normally in contact with the first flat portion FL1, or portions of the second bending portions EG2 adjacent to the second flat portion FL2 may not be normally in contact with the first bending portions EG1. As a result, a bonding failure may occur; for example, an air layer may be formed between the first and second layers LY1 and LY2.

According to an embodiment of the invention, the first and second flat portions FL1 and FL2 may be previously bonded to each other, and then, the first and second bending portions EG1 and EG2 may be bonded to each other. That is, the first and second flat portions FL1 and FL2 and the first and second bending portions EG1 and EG2 may be sequentially bonded to each other, and in this case, the afore-described bonding failure may not occur.

Figure 6F:
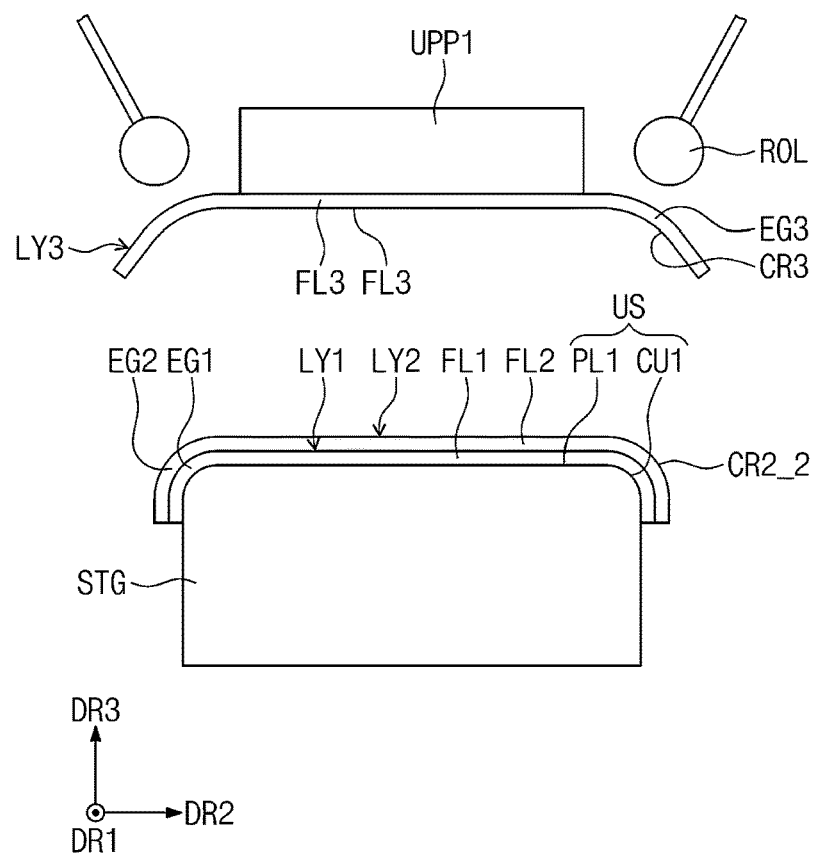

Referring to FIG. 6F, in a bonding process of the display device DD using the stage STG, a third layer LY3 may be further disposed between the stage STG and the pressing part UPP1. The third layer LY3 may be provided on the second layer LY2 after the second layer LY2 is bonded on the first layer LY1. The pressing part UPP1 may be disposed on the third layer LY3. The third layer LY3 may face the second layer LY2.

The third layer LY3 may be substantially the window WIN of FIG. 4. Thus, the third layer LY3 may include the third flat portion FL3 and the third bending portions EG3, which are curvedly extended from the opposite side portions of the third flat portion FL3 in outward and downward directions, like the window WIN.

The third flat portion FL3 may be disposed below the lower surface of the pressing part UPP1. The third flat portion FL3 may be disposed to be in contact with the lower surface of the pressing part UPP1. The third bending portions EG3 may be bent with a specific curvature and may be placed below the pressing part UPP1, when viewed in the first direction DR1. The third bending portions EG3 may be placed between the stage STG and the pressing part UPP1, in a state bent with a specific curvature.

A curvature CR3 of a lower surface of the third bending portions EG3 may be smaller than a curvature CR2_2 of an upper surface of the second bending portion EG2, which is a curvature of the upper surface of the second bending portion EG2 after pressed by the pressing rollers ROL. This structure will be described in more detail with reference to FIG. 6H.

Figure 6G:
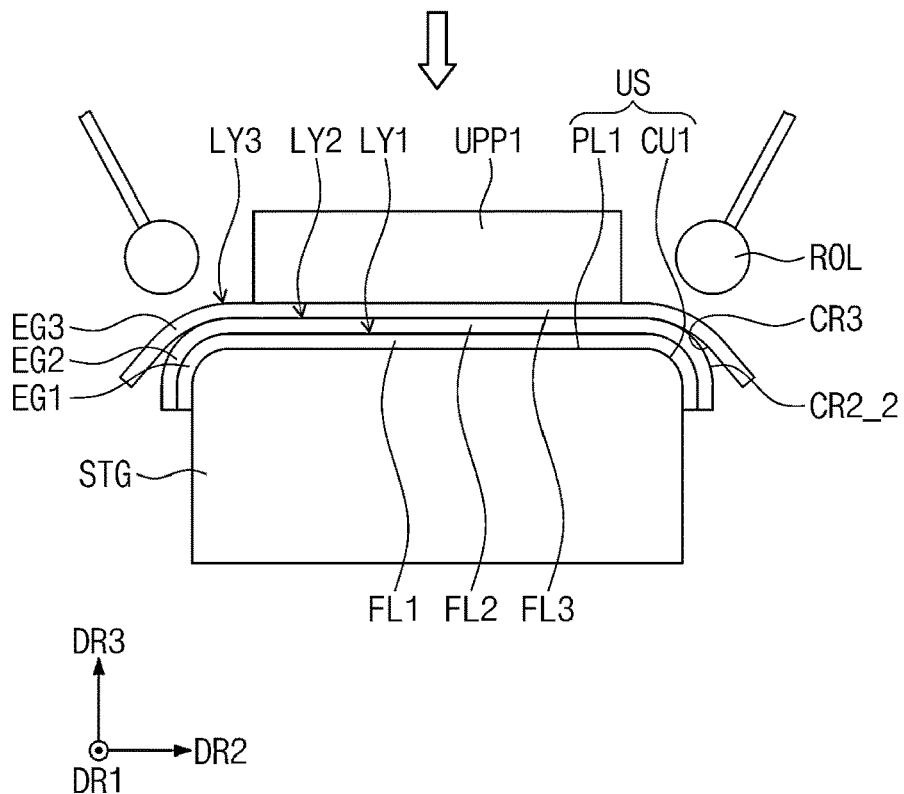

Referring to FIG. 6G, the pressing part UPP1 may be moved toward the stage STG or in the downward direction to bond the third layer LY3 to the second layer LY2.

The third flat portion FL3 may be bonded to the second flat portion FL2 by the pressing part UPP1 moving in the downward direction. Although not shown, an adhesive layer may be disposed between the second and third layers LY2 and LY3 to attach the third layer LY3 to the second layer LY2. The adhesive layer may be attached to an upper surface of the second layer LY2 in advance, or the adhesive layer, which is attached to a lower surface of the third layer LY3, may be disposed between the second and third layers LY2 and LY3. When the third flat portion FL3 is bonded to the second flat portion FL2, the third bending portions EG3 may be spaced apart from the second bending portions EG2.

The third bending portions EG3 and the second bending portions EG2 may be spaced apart from each other, because the curvature CR3 of the lower surface of the third bending portion EG3 is smaller than the curvature CR2_2 of the upper surface of the second bending portion EG2 when the third flat portion FL3 is bonded to the second flat portion FL2.

Figure 6H:
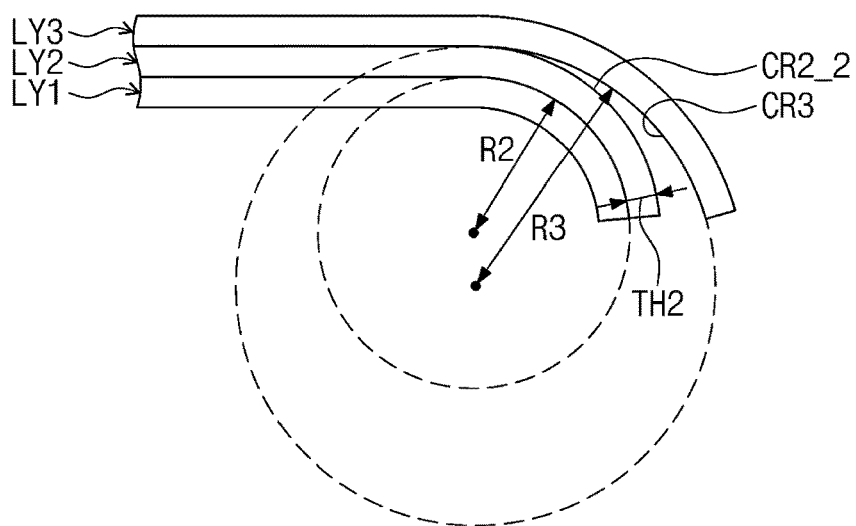

FIG. 6H is an enlarged view of the first, second, and third bending portions shown in FIG. 6G.

Referring to FIG. 6H, the curvature CR3 of the lower surface of the third bending portion EG3 may be smaller than the curvature CR2_2 of the upper surface of the second bending portion EG2. The lower surface of the third bending portion EG3 may have a concavely curved surface. The upper surface of the second bending portion EG2 may have a convexly curved surface.

A curvature radius R3 of the lower surface of the third bending portion EG3 may be set to a value that is larger than a sum of a curvature radius R2 of the lower surface of the second bending portion EG2 and a thickness TH2 of the second bending portion EG2.

Thus, the curvature radius R3 of the lower surface of the third bending portion EG3 may be larger than the curvature radius R2 of the lower surface of the second bending portion EG2. The thickness TH2 may be defined as a length measured in a direction perpendicular to a tangential surface of the curved upper surface of the second bending portion EG2. For example, the thickness TH2 may be a value measured in the direction normal to the upper surface of the second bending portion EG2.

The curvature and the curvature radius are concepts that are opposite to each other. Thus, the curvature CR3 of the lower surface of the third bending portion EG3 may be smaller than the curvature CR2_2 of the upper surface of the second bending portion EG2. In other words, the third bending portion EG3 may be bent less than the second bending portion EG2, and the second bending portion EG2 may be bent more than the third bending portion EG3.

Due to this structure, the third bending portion EG3 may have a curvature smaller than a curvature of the second bending portion EG2, and thus, the third bending portions EG3 may be spaced apart from the second bending portions EG2, when the second flat portion FL2 is bonded to the third flat portion FL3.

Figure 6I:
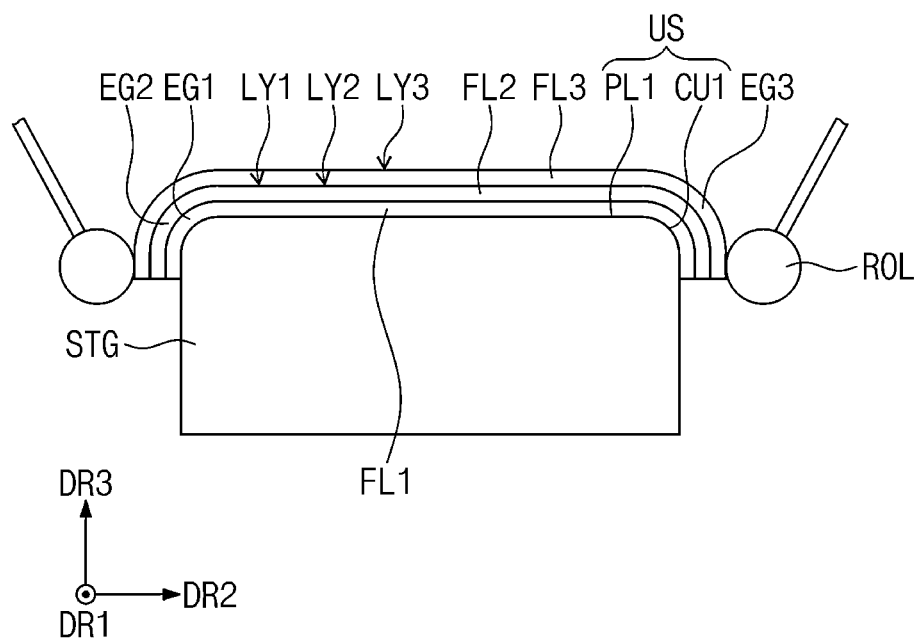

Referring to FIG. 6I, if the second and third flat portions FL2 and FL3 are bonded, the pressing rollers ROL may be disposed on the third bending portions EG3. The pressing rollers ROL may press the third bending portions EG3 toward the second bending portions EG2. The third bending portions EG3 may be pressed by the pressing rollers ROL and may be bonded to the second bending portions EG2. For example, in the case where the third bending portions EG3 are pressed by the pressing rollers ROL, the third bending portions EG3 may be moved toward the second bending portions EG2 and may be bonded to the second bending portions EG2.

The process described with reference to FIGS. 6A to 6E may be repeated to bond the third layer LY3 to the second layer LY2.

If the third bending portions EG3 have the same curvature as the second bending portions EG2 before pressed by the pressing rollers ROL, the third bending portions EG3 may be in contact with the second bending portions EG2 in advance before the bonding of the second and third flat portions FL2 and FL3. For example, lower portions of the third bending portions EG3 may be previously bonded to the second bending portions EG2 before pressed by the pressing rollers ROL.

In this case, the third flat portion FL3 may not be normally in contact with the second flat portion FL2, or portions of the third bending portions EG3 adjacent to the third flat portion FL3 may not be normally in contact with the second bending portions EG2. As a result, a bonding failure may occur; for example, an air layer may be formed between the second and third layers LY2 and LY3.

According to an embodiment of the invention, the second and third flat portions FL2 and FL3 may be previously bonded to each other, and then, the second and third bending portions EG2 and EG3 may be bonded to each other. Thus, the second and third flat portions FL2 and FL3 and the second and third bending portions EG2 and EG3 may be sequentially bonded to each other, and in this case, the afore-described bonding failure may not occur.

FIG. 7 is a diagram illustrating a structure of a bonding device according to another embodiment of the invention.

Referring to FIG. 7, a bonding device CD2 may include the stage STG and a pressing part UPP2, which is disposed over the stage STG. FIG. 7 illustrates a cross-section of the bonding device CD2, when viewed in the first direction DR1. For concise description, an element previously described with reference to FIG. 1 may be identified by the same reference number without repeating an overlapping description thereof.

The pressing part UPP2 may include a guide film GF and fastening parts FP, which are connected to opposite side portions of the guide film GF. The fastening parts FP may be disposed to be symmetric with respect to each other in the second direction DR2. The guide film GF and the fastening parts FP may be disposed over the stage STG.

The guide film GF may include a flat portion GF_PL, which is provided to face the first plane PL1 of the stage STG, and bending portions GF_CU, which are extended from opposite side portions of the flat portion GF_PL in outward and downward directions and have a curved shape. The flat portion GF_PL may have a plane (i.e., flat surface) defined by the first and second directions DR1 and DR2. The bending portions GF_CU may have a shape that is curved with a specific curvature, when viewed in the first direction DR1.

The bending portions GF_CU may have a curvature different from the first curved surfaces CU1 of the stage STG. For example, the bending portions GF_CU may have a curvature smaller than a curvature of the first curved surfaces CU1. In other words, the bending portions GF_CU may be bent less than the first curved surfaces CU1.

FIG. 8A to 8D are diagrams illustrating a method of bonding a display device using the bonding device of FIG. 7.

Figure 8A:
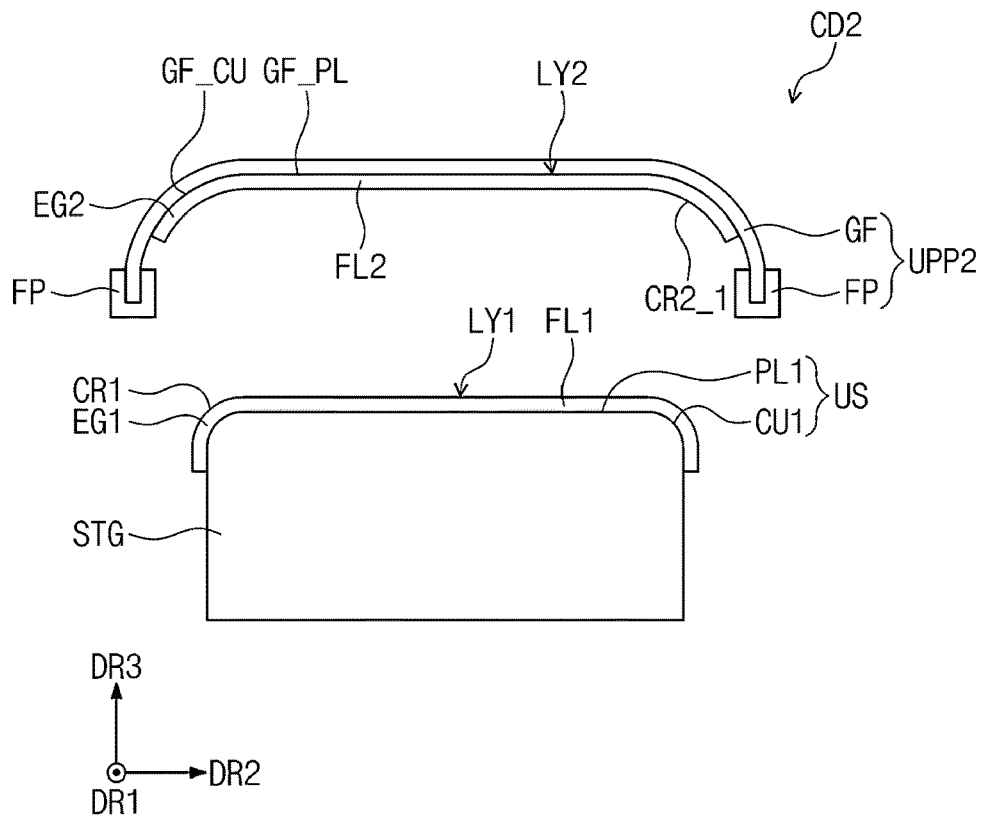
FIG. 8A to 8D are diagrams illustrating a method of bonding a display device using the bonding device of FIG. 7.

Referring to FIG. 8A, when a bonding process of the display device DD using the bonding device CD2 is performed, the first and second layers LY1 and LY2 may be disposed between the stage STG and the guide film GF. The first layer LY1 may be disposed on the stage STG, the second layer LY2 may be disposed over the first layer LY1, and the guide film GF may be disposed on the second layer LY2. The second layer LY2 may face the first layer LY1.

The first layer LY1 may be substantially the supporting plate PLT of FIG. 6A. Thus, the first layer LY1 may include the first flat portion FL1 and the first bending portions EG1, like the first layer LY1 of FIG. 6A.

The second layer LY2 may be substantially the display panel DP of FIG. 6A. Thus, the second layer LY2 may include the second flat portion FL2 and the second bending portions EG2, like the second layer LY2 of FIG. 6A.

The second flat portion FL2 may be disposed below the flat portion GF_PL of the guide film GF. The second flat portion FL2 may be disposed to be in contact with a lower surface of the flat portion GF_PL of the guide film GF.

The second bending portions EG2 may be bent with specific curvatures and may be placed below a lower surface of the bending portion GF_CU of the guide film GF, when viewed in the first direction DR1. The second bending portions EG2 and the bending portions GF_CU may have a curved shape of the same curvature. For example, the upper surface of the second bending portion EG2 and the lower surface of the bending portion GF_CU may have the same curvature.

The first and second bending portions EG1 and EG2 may be disposed between the stage STG and the guide film GF, in a state bent with a specific curvature.

In the embodiment of FIG. 8A, the curvature CR2_1 of the lower surface of the second bending portion EG2 may be smaller than the curvature CR1 of the upper surface of the first bending portion EG1, as described in FIGS. 6A to 6C.

Figure 8B:
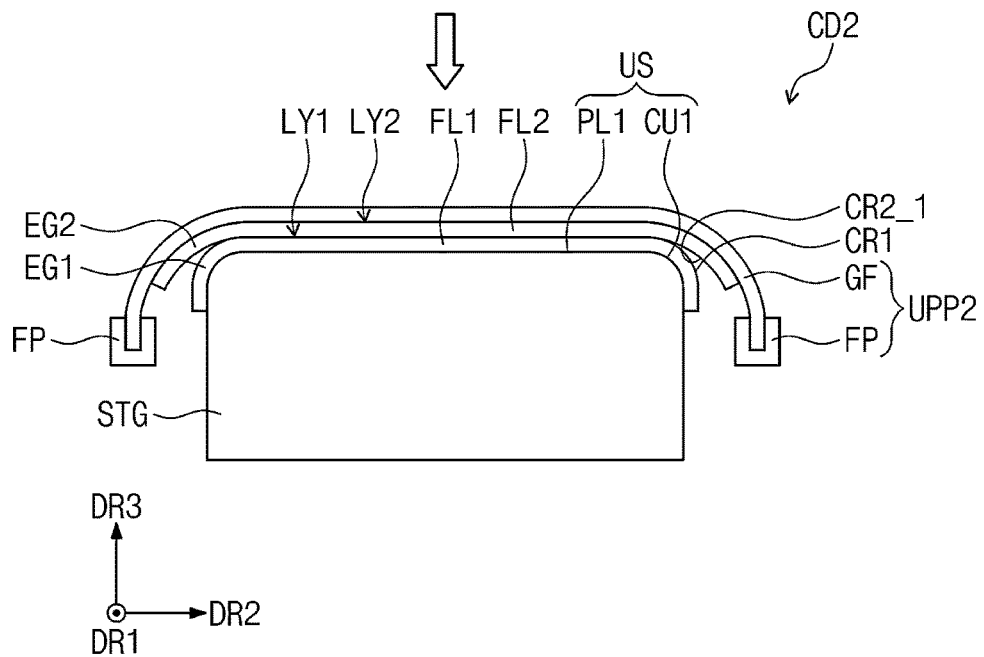

Referring to FIG. 8B, the guide film GF may be moved toward the stage STG or in the downward direction to bond the second layer LY2 to the first layer LY1.

The second flat portion FL2 may be bonded to the first flat portion FL1 by the guide film GF moving in the downward direction. When the second flat portion FL2 is bonded to the first flat portion FL1, the second bending portions EG2 may be spaced apart from the first bending portions EG1.

The second bending portions EG2 and the first bending portions EG1 may be spaced apart from each other, because the curvature CR2_1 of the lower surface of the second bending portion EG2 is smaller than the curvature CR1 of the upper surface of the first bending portion EG1 when the second flat portion FL2 is bonded to the first flat portion FL1.

The fastening parts FP may be disposed at a level lower than the first and second layers LY1 and LY2. The fastening parts FP may be disposed on side surfaces of the stage STG, which are opposite to each other in the second direction DR2.

Figure 8C:
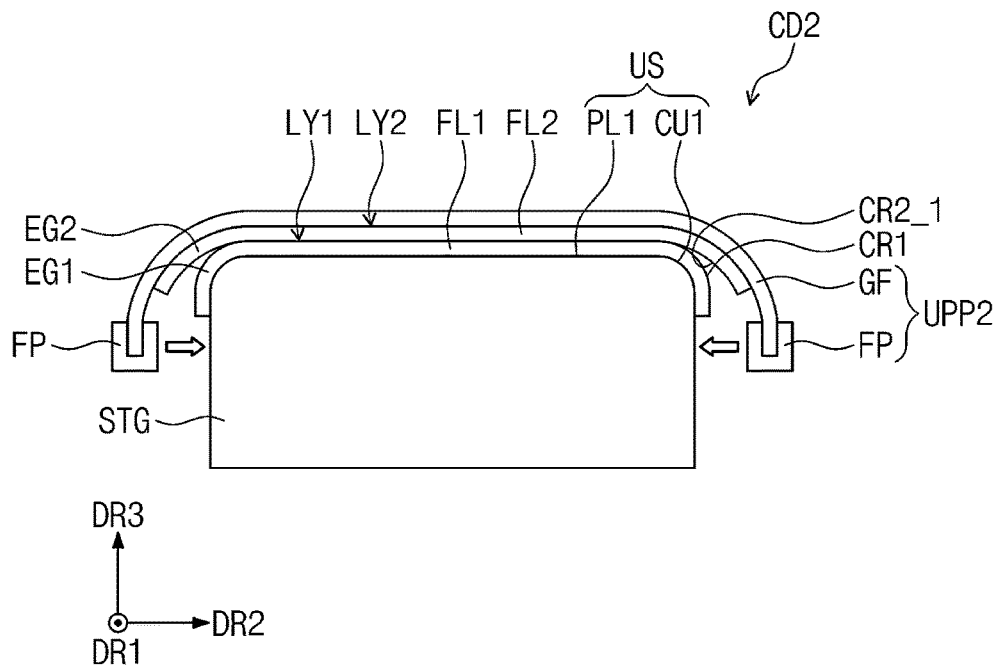
Figure 8D:
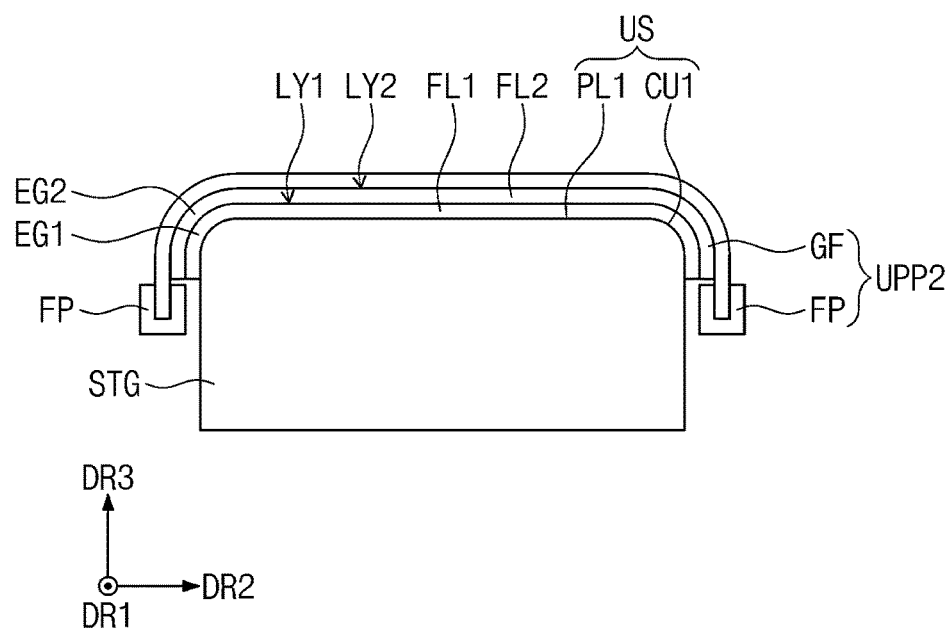

Referring to FIGS. 8C and 8D, the fastening parts FP may be moved toward a side surface of the stage STG, after the bonding of the first and second flat portions FL1 and FL2 using the guide film GF moving in the downward direction. As a result of the motion of the fastening parts FP toward the side surface of the stage STG, the second bending portions EG2 may be bonded to the first bending portions EG1. For example, the fastening parts FP may be moved toward the stage STG to reduce a distance therebetween, and in this case, the fastening parts FP may exert a pressure on the second bending portions EG2. The second bending portions EG2 may be moved toward the first bending portions EG1 by such a pressure, and as a result, the second bending portions EG2 may be bonded to the first bending portions EG1.

According to this sequential bonding process using the bonding device CD2, the second flat portion FL2 may be previously bonded to the first flat portion FL1, and then, the second bending portions EG2 may be bonded to the first bending portions EG1. Thus, the afore-described bonding failure may not occur.

Although not shown, the third layer LY3 may be bonded to the second layer LY2 in a similar manner to the process described with reference to FIG. 6F to 6I. For example, the process of FIGS. 8A to 8D may be repeated to attach the third layer LY3 to the second layer LY2. After the bonding of the second layer LY2 to the first layer LY1, the third layer LY3 may be disposed on the second layer LY2. The third layer LY3 may be disposed below the guide film GF. The guide film GF may be moved in the downward direction such that the third layer LY3 is bonded to the second layer LY2 in the same manner as the method of bonding the second layer LY2 to the first layer LY1.

Figure 9:
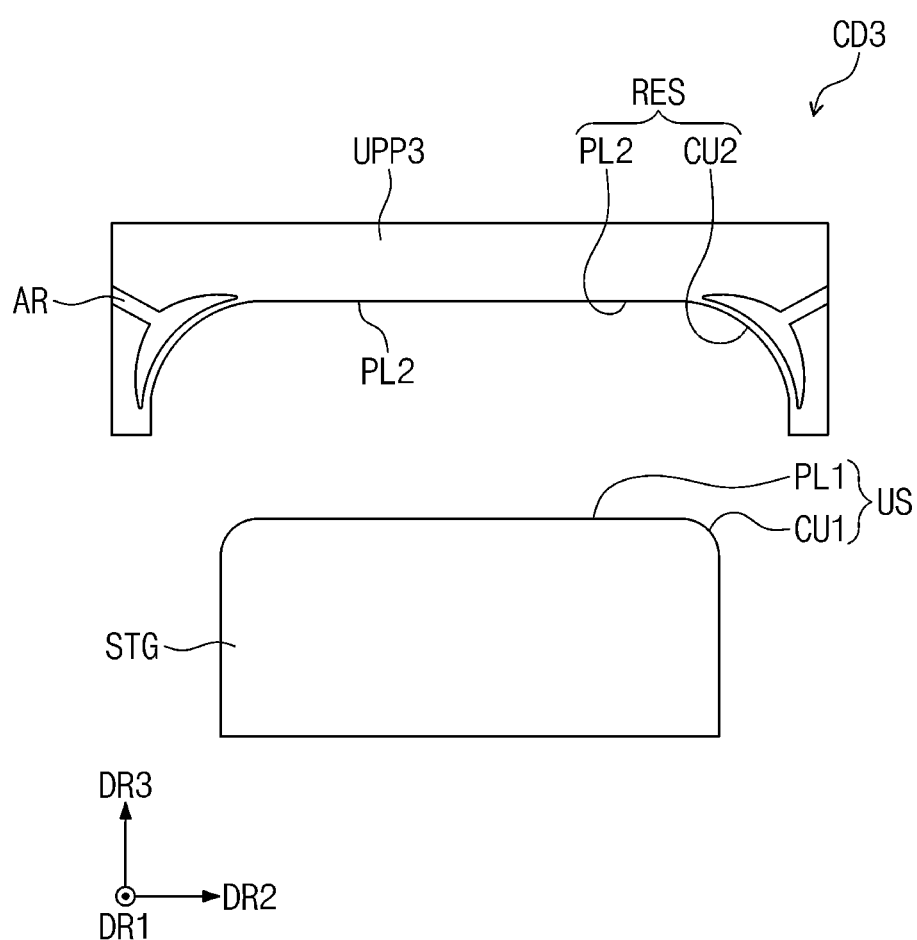
FIG. 9 is a diagram illustrating a structure of a bonding device according to still another embodiment of the invention.

FIG. 9 is a diagram illustrating a structure of a bonding device according to still another embodiment of the invention.

Referring to FIG. 9, a bonding device CD3 may include the stage STG and a pressing part UPP3, which is disposed over the stage STG. FIG. 9 illustrates a cross-section of the bonding device CD3, when viewed in the first direction DR1. For concise description, an element previously described with reference to FIG. 1 may be identified by the same reference number without repeating an overlapping description thereof.

The pressing part UPP3 may be formed of or include a material having an elastic property. For example, the pressing part UPP3 may be formed of or include an elastic material (e.g., rubber), but the invention is not limited to this example.

The pressing part UPP3 may include a recessed portion RES facing the upper surface US of the stage STG. The recessed portion RES may include a second plane PL2 facing the first plane PL1. The second plane PL2 may have a plane (i.e., a flat surface) defined by the first and second directions DR1 and DR2. The second plane PL2 may be disposed on the first plane PL1. The recessed portion RES may include second curved surfaces CU2, which are provided to face the first curved surfaces CU1 and are extended downward from opposite side portions of the second plane PL2 to have a concavely curved shape. The second curved surfaces CU2 may have a shape that is curved with a specific curvature, when viewed in the first direction DR1.

The second curved surfaces CU2 may have a curvature different from the first curved surfaces CU1 of the stage STG. For example, the second curved surfaces CU2 may have a curvature smaller than a curvature of the first curved surfaces CU1. That is, the second curved surfaces CU2 may be bent less than the first curved surfaces CU1.

Air injection holes AR, which are recessed toward the second curved surfaces CU2, may be defined in an outer surface of the pressing part UPP3. The air injection holes AR may be extended along the second curved surfaces CU2. The air injection holes AR may not be disposed on the second plane PL2. In the case where the air is injected or supplied into the air injection holes AR, the second curved surfaces CU2 may be expanded.

FIG. 10A to 10D are diagrams illustrating a method of bonding a display device using the bonding device of FIG. 9.

Figure 10A:
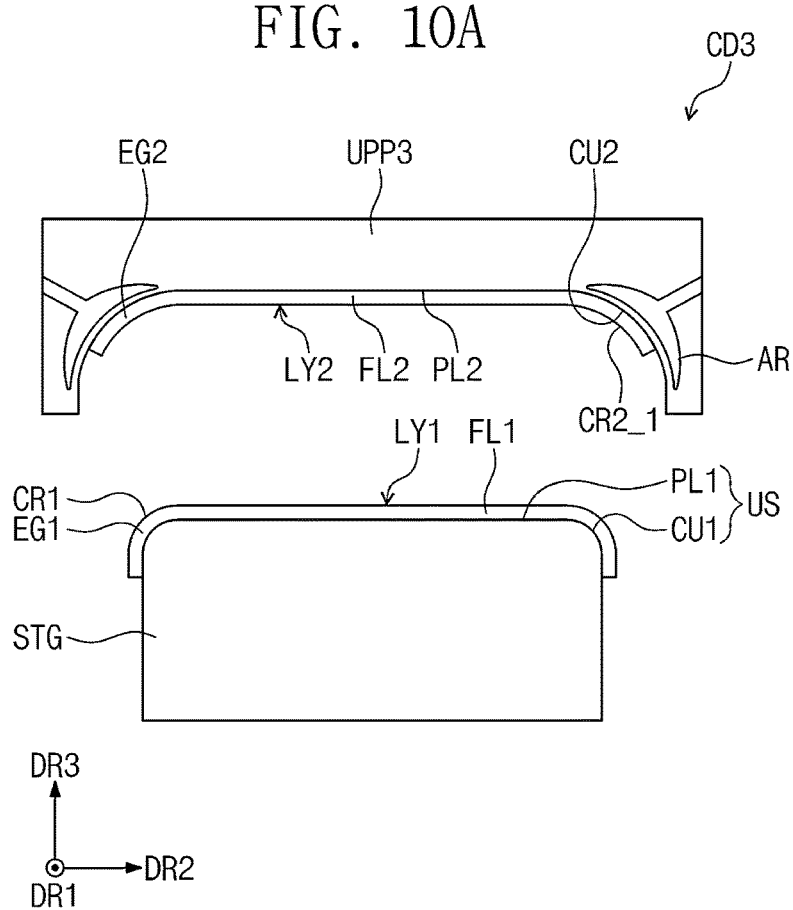
FIG. 10A to 10D are diagrams illustrating a method of bonding a display device using the bonding device of FIG. 9.

Referring to FIG. 10A, when a bonding process of the display device DD using the bonding device CD3 is performed, the first and second layers LY1 and LY2 may be disposed between the stage STG and the pressing part UPP3. The first layer LY1 may be disposed on the stage STG, the second layer LY2 may be disposed over the first layer LY1, and the pressing part UPP3 may be disposed on the second layer LY2. The second layer LY2 may face the first layer LY1.

The first layer LY1 may be substantially the supporting plate PLT of FIG. 6A. Thus, the first layer LY1 may include the first flat portion FL1 and the first bending portions EG1, like the first layer LY1 of FIG. 6A.

The second layer LY2 may be substantially the display panel DP of FIG. 6A. Thus, the second layer LY2 may include the second flat portion FL2 and the second bending portions EG2, like the second layer LY2 of FIG. 6A.

The second flat portion FL2 may be disposed below the second plane PL2 of the pressing part UPP3. The second flat portion FL2 may be disposed to be in contact with a lower surface of the second plane PL2 of the pressing part UPP3.

The second bending portions EG2 may be bent with specific curvatures and may be placed below the second curved surfaces CU2 of the pressing part UPP3, when viewed in the first direction DR1. The second bending portions EG2 and the second curved surfaces CU2 may have a curved shape of the same curvature. For example, the upper surface of the second bending portion EG2 and the lower surface of the second curved surface CU2 may have the same curvature.

The first and second bending portions EG1 and EG2 may be disposed between the stage STG and the pressing part UPP3, in a state bent with a specific curvature.

In the embodiment of FIG. 10A, the curvature $CR2\_1$ of the lower surface of the second bending portion EG2 may be smaller than the curvature CR1 of the upper surface of the first bending portion EG1, as described in FIGS. 6A to 6C.

Figure 10B:
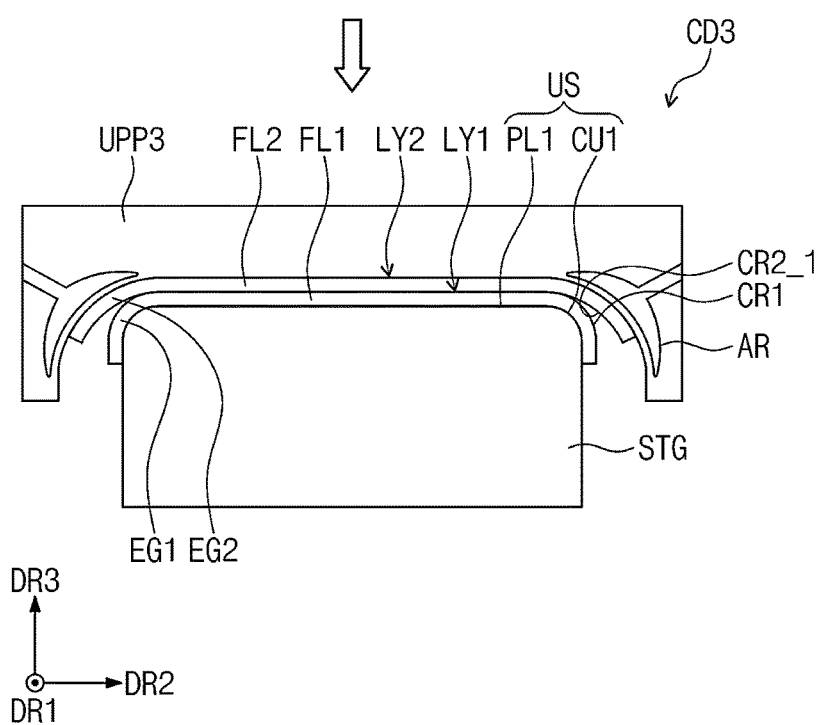

Referring to FIG. 10B, the pressing part UPP3 may be moved toward the stage STG or in the downward direction to bond the second layer LY2 to the first layer LY1.

The second flat portion FL2 may be bonded to the first flat portion FL1 by the pressing part UPP3 moving in the downward direction. When the second flat portion FL2 is bonded to the first flat portion FL1, the second bending portions EG2 may be spaced apart from the first bending portions EG1.

The second bending portions EG2 and the first bending portions EG1 may be spaced apart from each other, because the curvature $CR2\_1$ of the lower surface of the second bending portion EG2 is smaller than the curvature CR1 of the upper surface of the first bending portion EG1 when the second flat portion FL2 is bonded to the first flat portion FL1.

Figure 10C:
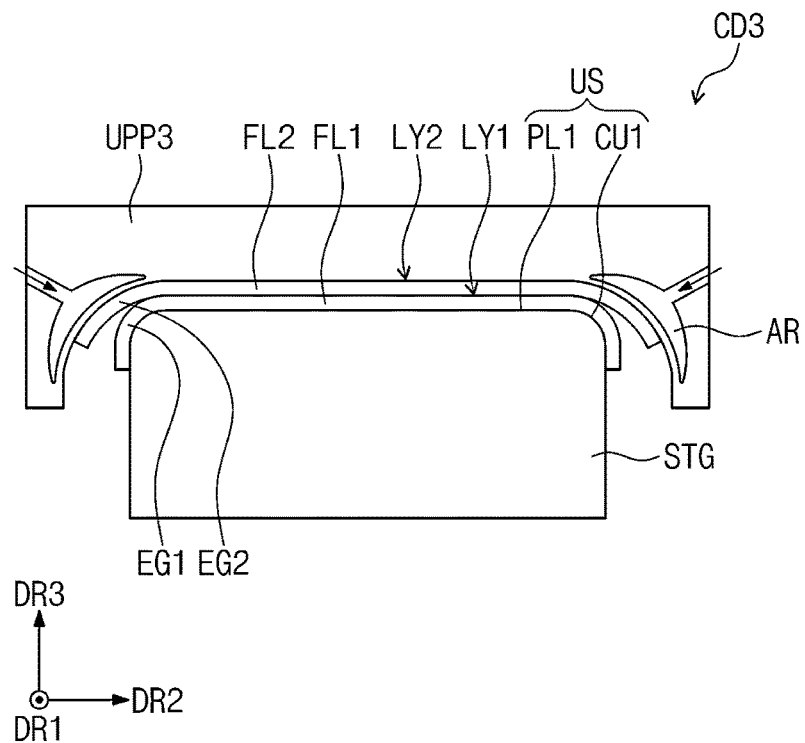
Figure 10D:
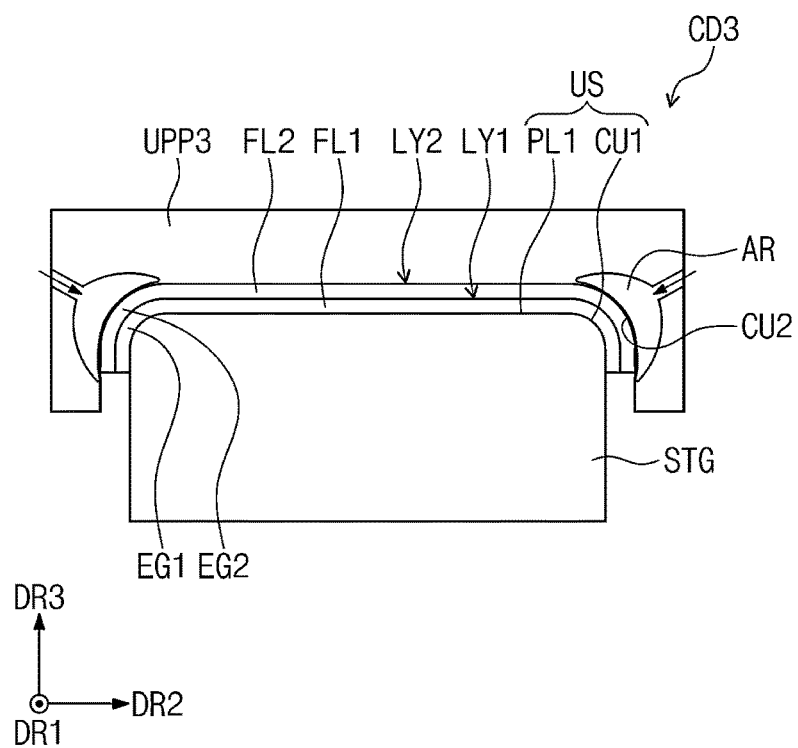

Referring to FIGS. 10C and 10D, the air may be injected into the air injection holes AR of the pressing part UPP3, after the bonding of the first and second flat portions FL1 and FL2 using the pressing part UPP3 moving in the downward direction. As a result of the injection of the air, the second curved surfaces CU2 may be expanded and may be moved toward the stage STG. Since the second curved surfaces CU2 are moved toward the first curved surfaces CU1 of the stage STG, the second bending portions EG2 may be bonded to the first bending portions EG1. Since the second curved surfaces CU2 are moved toward the first curved surfaces CU1 of the stage STG, the second curved surfaces CU2 may exert a pressure on the second bending portions EG2. The second bending portions EG2 may be moved toward the first bending portions EG1 by such a pressure, and as a result, the second bending portions EG2 may be bonded to the first bending portions EG1.

According to this sequential bonding process using the bonding device CD3, the second flat portion FL2 may be previously bonded to the first flat portion FL1, and then, the second bending portions EG2 may be bonded to the first bending portions EG1. Thus, the afore-described bonding failure may not occur.

Although not shown, the third layer LY3 may be bonded to the second layer LY2 in a similar manner to the process described with reference to FIG. 6F to 6I. For example, the process of FIGS. 10A to 10D may be repeated to attach the third layer LY3 to the second layer LY2. After the bonding of the second layer LY2 to the first layer LY1, the third layer LY3 may be disposed on the second layer LY2. The third layer LY3 may be disposed below the pressing part UPP3. The pressing part UPP3 may be moved in the downward direction such that the third layer LY3 is bonded to the second layer LY2 in the same manner as the method of bonding the second layer LY2 to the first layer LY1.

In a bonding device according to an embodiment of the invention and a method of fabricating a display device using the same, a bonding process may be first performed on flat portions of each layer and then on bending portions of the layer. Accordingly, it may be possible to prevent a bonding failure from occurring in the layers.

While example embodiments of the invention have been particularly shown and described, it will be understood by one of ordinary skill in the art that variations in form and detail may be made therein without departing from the spirit and scope of the attached claims.

What is claimed is:

1. A bonding device, comprising:
a stage; and
a pressing part placed on the stage and which is movable toward the stage,
wherein a first layer, which is disposed on an upper surface of the stage, includes a first flat portion and first bending portions, which are curvedly extended from opposite side portions of the first flat portion, respectively,
a second layer, which is disposed below a lower surface of the pressing part to face the first layer, includes a second flat portion and second bending portions, which are curvedly extended from opposite side portions of the second flat portion, respectively,
the first and second bending portions are disposed between the stage and the pressing part, in a state bent with curvatures, respectively,
and the curvature of a lower surface of each of the second bending portions is smaller than the curvature of an upper surface of each of the first bending portions,
wherein an upper surface of the stage facing the pressing part comprises:
a first plane; and
first curved surfaces, which are extended from opposite side portions of the first plane in outward and downward directions and have a convexly curved shape,
wherein the first flat portion is disposed on the first plane,
the first bending portions are disposed on the first curved surfaces, respectively, and
the first curved surfaces and the first bending portions have a same curvature,
wherein the pressing part comprises a recessed portion facing the upper surface of the stage,
the recessed portion comprises:
a second plane facing the first plane; and
second curved surfaces, which are provided to face the first curved surfaces and are extended downward from opposite side portions of the second plane to have a concavely curved shape,
the second flat portion is disposed below the second plane, and
the second bending portions are disposed below the second curved surfaces,
wherein an air injection hole, which is recessed from an outer surface of the pressing part toward the second curved surfaces, is defined in the pressing part, and
the second curved surfaces are expanded toward the first bending portions by air injected into the air injection hole, after the second flat portion is bonded to the first flat portion by the pressing part, which moves in the downward direction.

2. The bonding device of claim 1, wherein a curvature radius of the lower surface of each of the second bending portions is set to a value that is larger than a sum of a curvature radius of a lower surface of each of the first bending portions and a thickness of each of the first bending portions.

3. The bonding device of claim 1, wherein the second flat portion is bonded to the first flat portion by the pressing part, which moves in a downward direction.

4. The bonding device of claim 3, wherein the second bending portion is spaced apart from the first bending portion, when the second flat portion is bonded to the first flat portion at first.

5. The bonding device of claim 1, wherein the second curved surfaces have a curvature smaller than a curvature of each of the first curved surfaces.

6. The bonding device of claim 1, wherein the second curved surfaces have a same curvature as the second bending portions.

* * * * *